United States Patent [19]

Luthra et al.

[11] Patent Number: 5,023,825

[45] Date of Patent: Jun. 11, 1991

[54] COEFFICIENT REDUCTION IN A LOW RATIO SAMPLING RATE CONVERTER

[75] Inventors: Ajay K. Luthra, Beaverton; Ganesh Rajan, Portland, both of Oreg.

[73] Assignee: Tektronix, Inc., Beaverton, Oreg.

[21] Appl. No.: 569,598

[22] Filed: Aug. 20, 1990

Related U.S. Application Data

[63] Continuation of Ser. No. 379,850, Jul. 14, 1989, abandoned.

[51] Int. Cl.⁵ .............................................. G06F 15/31
[52] U.S. Cl. ................................................ 364/724.10

[56] References Cited

U.S. PATENT DOCUMENTS

| | | | |
|---|---|---|---|
| 3,997,773 | 12/1976 | Van Essen et al. | 364/724.10 |
| 4,472,785 | 9/1984 | Kasuga | 364/724.10 |
| 4,584,659 | 4/1986 | Stikvoort | 364/724.10 |
| 4,837,619 | 6/1989 | Tsinberg | 358/140 |
| 4,866,647 | 9/1989 | Farrow | 364/724.10 |
| 4,881,191 | 11/1989 | Morton | 364/724.10 |

OTHER PUBLICATIONS

Digital Methods for Conversion Between Arbitrary Sampling Frequencies (Tor A. Ramstad) IEEE Trans. on Acoustics, Speech, and Signal Processing, vol. 32, No. 3, Jun. 1984, pp. 557–591.

Primary Examiner—Gary V. Harkcom
Assistant Examiner—Long T. Nguyen
Attorney, Agent, or Firm—Francis I. Gray

[57] ABSTRACT

A technique for reducing the number of coefficients in a low ratio sampling rate converter divides each input sampling rate interval into a plurality of bins. For each bin a set of conversion coefficients is computed. So long as output data samples lie within the same bin, the same set of coefficients is applied. When the output data samples move to another bin, the set of coefficients applied is changed. Thus a finite set of coefficients are computed rather than computing an exact set for each output data sample.

2 Claims, 2 Drawing Sheets

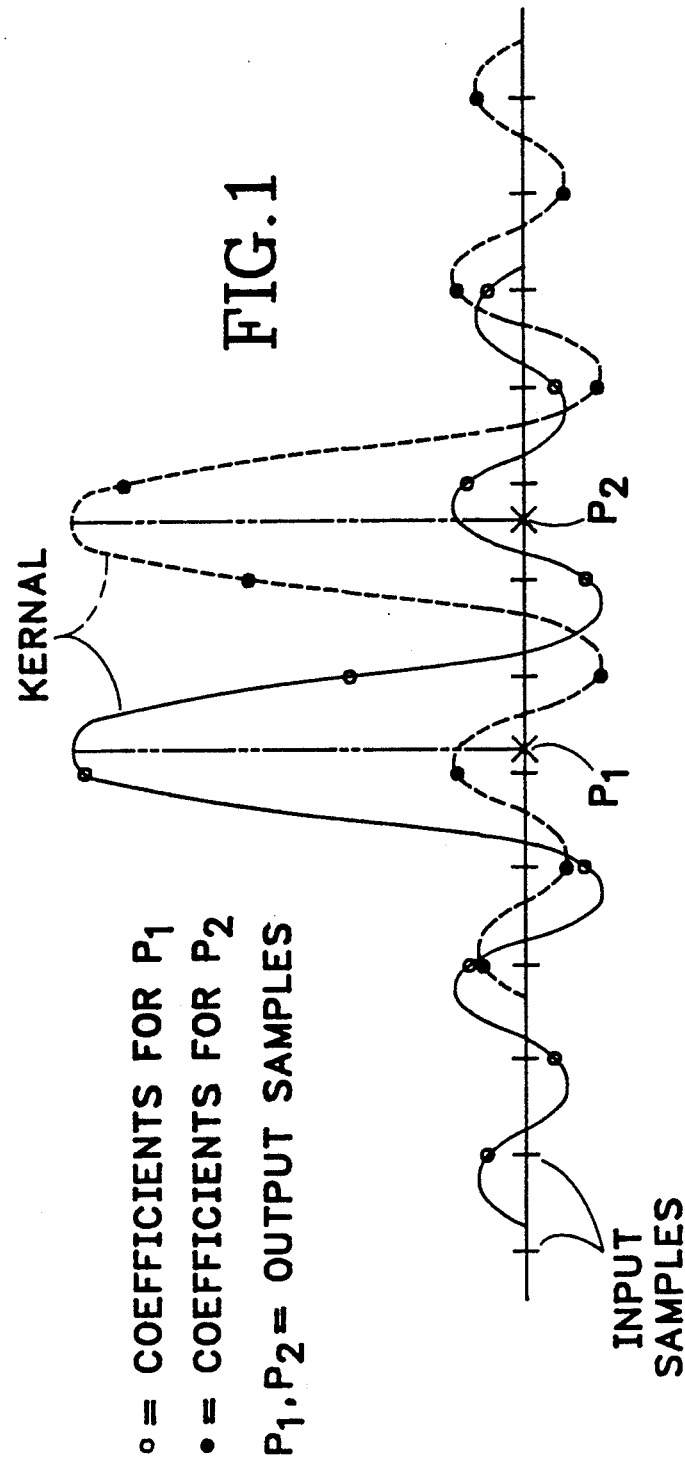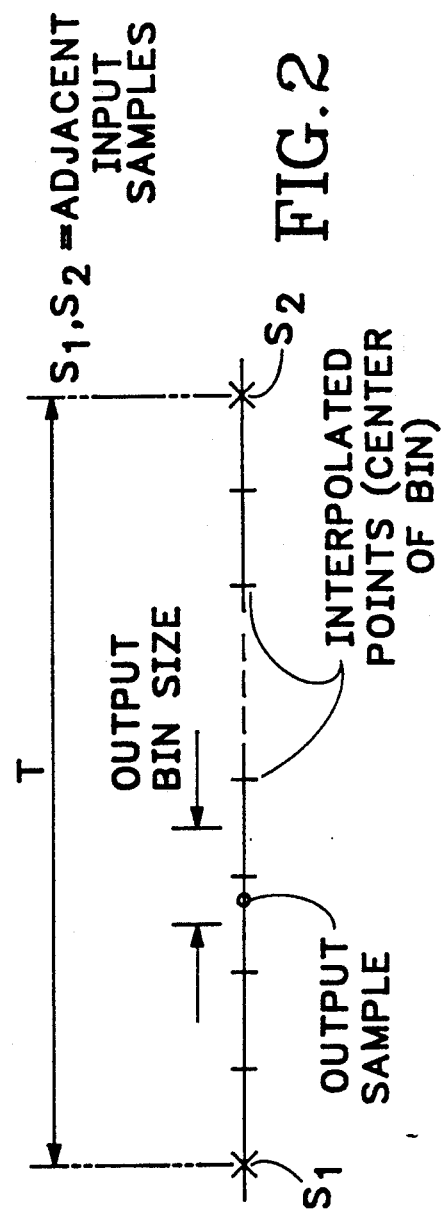

COEFFICIENT REDUCTION IN A LOW RATIO SAMPLING RATE CONVERTER

This is a continuation of application Ser. No. 379,850 filed July 14, 1989 and now abandoned.

BACKGROUND OF THE INVENTION

The present invention relates to sampling rate converters, and more particularly to a technique for reducing the number of coefficients in a low ratio sampling rate converter to minimize memory and maximize speed requirements where the ratio between the sampling rates is close to one.

Many different standards have been and are being created in both the video and audio worlds. With the sharp increase in the usage of digital technology in the television industry as well as the advent of high definition television, many new standards have recently emerged and many new ones are being proposed. One of the specifications in all these standards is the sampling rate, with different standards specifying different sampling rates. In one dimensional form the sampling rate specifies the spacing between adjacent samples, while in the two and three dimensional forms for television video it specifies the spacing between horizontal lines and the frame rate, respectively. Therefore there is a growing need for sampling rate converters so that systems using different specifications can communicate with each other.

To convert the sampling rate the signal values at the locations between the samples at the first sampling rate have to be evaluated. For this purpose a kernel is used to interpolate between the samples. Ideally a sinc, or $\sin(x)/x$, function is the kernel. However, as the sinc function is an infinitely long function, various different time limited functions are used instead. The kernel has to be long enough that N input samples are required to calculate one output sample. Therefore there are N sampled values of the kernel that become the coefficients to multiply with the input data values. If the relationship, or separations, between the locations of the input and output samples vary for different output samples, as is the case when the input and output sampling rates are different, then a different set of N coefficients, the sampled values of the kernel, is required for each output sampled. The number of such sets required is a function of input and output sampling rates. If the ratio of the input and output sampling rates is close to one, then a very large set of coefficients is needed.

For example in video one sampling rate is four times the color subcarrier frequency, or 14.318180 MSamples/sec for NTSC and 17.734475 MSamples/sec for PAL, another rate is the CCIR 601 standard of 13.5 MSamples/sec, and yet another rate is a PAL "line locked sampling rate" of 17.734375 MSamples/sec. Taking the two PAL sampling rates, the difference is only 100 Hz equivalent to a ratio of approximately 1.000005639:1. In this particular case there are 709379 distinct output sample locations, and therefore 709379xN sample values of the convolution kernel. For N=10 this implies a calculation of more than $7 \times 10^6$ coefficient values. At video signal rates these values cannot be easily computed on the fly. To alternatively precalculate and store these coefficient values leads to a large memory requirement. Since each different output sample requires a different set of coefficients, memory access rate needs to be at the video output rate of 17.734475 MHz, i.e., the memory cannot be slow, and thus low cost.

What is desired is a method of reducing the number of coefficients in a sampling rate converter so that a slow, low cost memory may be used to prestore the necessary coefficients.

SUMMARY OF THE INVENTION

Accordingly the present invention provides a technique for reducing the number of coefficients for a filter in a low ratio sampling rate converter by dividing the sampling interval of the input sampling rate into a finite number of bins and precalculating the coefficients for the bins to produce the output sampling rate. A finite input response (FIR) filter receives at its input at the output sampling rate a plurality of samples that were obtained at the input sampling rate. A coefficient memory contains the coefficients for each bin. When the output samples move to the next bin, a coefficient controller accesses the coefficient memory to output a new set of coefficients for the FIR filter. Since there are multiple samples per bin when the ratio is very nearly one, a slow, inexpensive memory may be used as the coefficient memory. Also for on the fly operation the coefficients may be calculated at a rate significantly less than the video rates, eliminating the need for the coefficient memory altogether.

The objects, advantages and other novel features of the present invention are apparent from the following detailed description when read in conjunction with the appended claims and attached drawing.

BRIEF DESCRIPTION OF THE DRAWING

FIG. 1 is a graph diagram representing data rate conversion between two sampling rates.

FIG. 2 is a graph diagram representing data rate conversion between two sampling rates using bins according to the present invention.

DESCRIPTION OF THE PREFERRED EMBODIMENT

Figure 3:
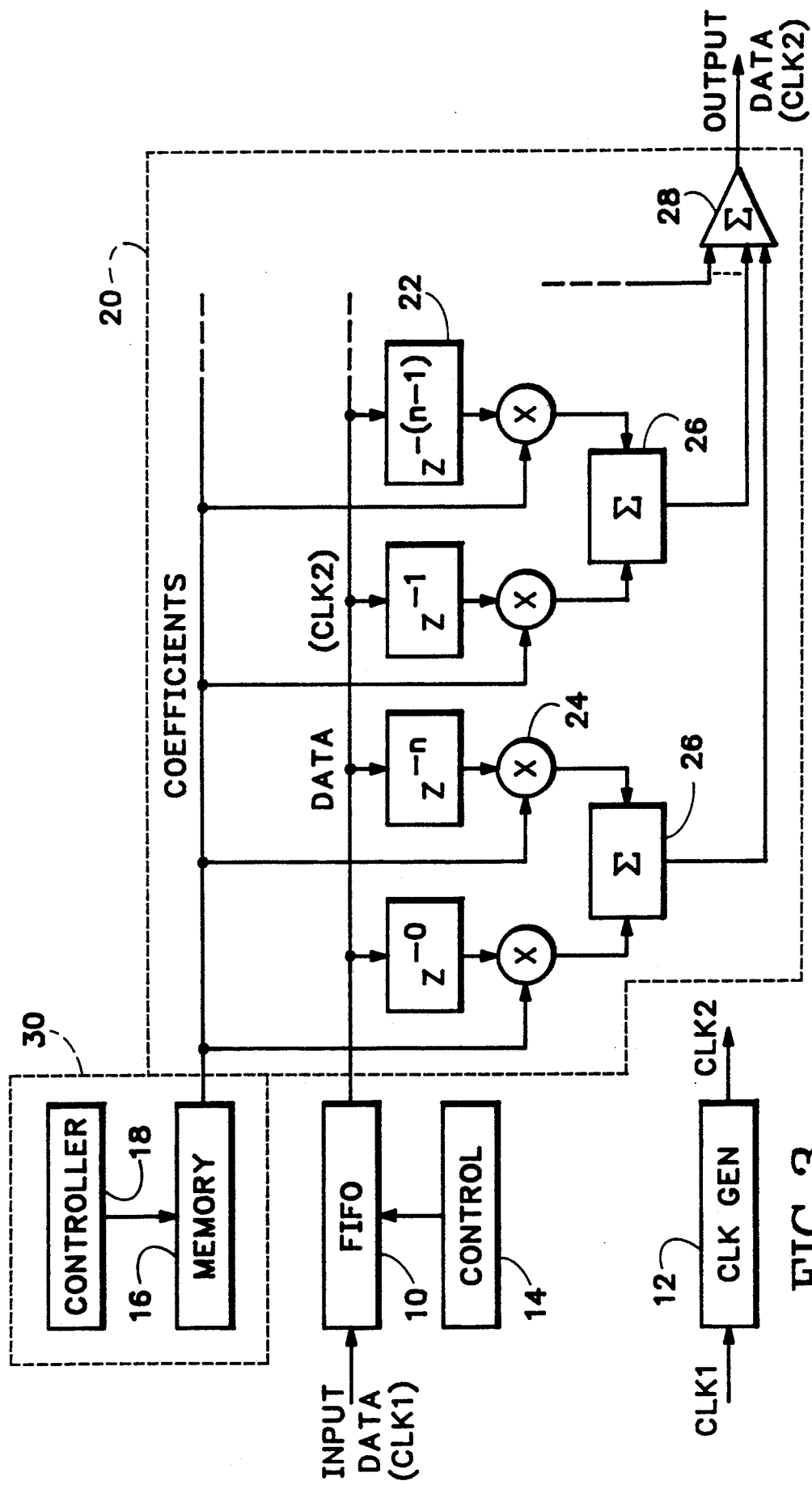
FIG. 3 is a block diagram of a variable coefficient FIR filter to perform data rate conversion according to the present invention.

To reduce the number of coefficients the problem is simplified by considering the fact that the accuracy desired in the output signal samples is of the order of b bits. For a sinusoid of frequency f Hz, the peak error, e, in the amplitude measurement, due to an inaccuracy of $+/-dt$ in the sampling instant, t, is given by $$e = 2A\sin(\pi f dt) = 2A\pi f dt \quad (1)$$

where A is the amplitude of the sinusoid. An accuracy of at least b bits implies that the maximum error, e, can be equal to $Ax2^{-b}$. Substituting for e in equation (1) and rearranging the terms, $$dt = 1/(2\pi f 2^b) \quad (2)$$

In other words the time jitter, dt, is equivalent to an amplitude error of less than one quantization level using b bits.

From equation (2) for a sinusoid of 5 MHz, to obtain an accuracy of at least eight bits, the time jitter should not exceed $+/-124.34$ picoseconds. Similarly for a sinusoid of 5.5 MHz a desired output accuracy of at least 10 bits is equivalent to a time jitter less than +/−28.26 picoseconds in the sampling instants.

Referring now to FIG. 1 the input data samples at a first sampling rate are multiplied by coefficients represented by dots on the respective superimposed kernels that are centered on the respective output data samples at a second sampling rate. Therefore each output data sample has a different set of coefficients. However as shown in FIG. 2 the duration of one input sampling period T may be split into T/(2dt) intervals, or bins. All the output sample values corresponding to sampling instants within one bin are approximated by the sample value corresponding to the center of that interval. As long as the locations of the output samples stay within the same bin, the same set of coefficients is used.

Therefore to obtain a ten bit accuracy for a sinusoid of 5.5 MHz sampled at a rate of 17.734375 MHz, the sampling period is divided into 2,000 bins. Each bin is characterized by one set of coefficients so that only 2000xN values are required. For N=10 this implies a storage of only 20,000 coefficients, as compared to more than $7 \times 10^6$ required for the exact evaluation of the output samples. If each coefficient requires two bytes of storage space, the overall memory requirement is reduced from more than 14 Mbytes to only 40 kbytes, achieving over two orders of reduction in the storage. Also the coefficients need be changed once for every 177 or 178 output samples. Therefore the coefficient memory may be a slow memory, further reducing the cost. Alternatively since the coefficients need be computed once for every 177 or 178 output samples, they now may be calculated on the fly, thus eliminating the storage requirement altogether.

A device for converting data between two sampling rates is shown in FIG. 3. An input data signal, such as a video signal sampled at 17.734375 MHz, is input to a first-in/first-out (FIFO) buffer register 10. The input data signal is clocked into the FIFO register 10 at a first clock rate CLK1, and clocked out at a second clock rate CLK2 corresponding to the output sample rate, such as 17.734475 MHz. A clock generator 12 converts the input sample rate CLK1 into the output sample rate CLK2. A FIFO controller 14 controls the data into and out of the FIFO register 10. For precalculated coefficients a coefficient memory 16 stores the necessary sets of coefficients. The coefficients used from the coefficient memory 16 are determined by a coefficient controller 18. The coefficients from the coefficient memory 16 and the data from the FIFO register 10 are output over respective buses for input to a FIR filter 20. The data is delayed by appropriate delay intervals established by delay lines 22, and then multiplied by the appropriate coefficients in multipliers 24. Samples are then combined in summers 26, and the outputs from all the summers are combined in an adder 28 to provide the desired output data samples at the output sample rate.

Alternatively the coefficient controller 18 and coefficient memory 16 may be replaced with a microprocessor 30 that computes the coefficients on the fly as needed for every 177 or 178 samples for the example referred to above. Then the controller 18 becomes a computer and the memory 16 becomes the program and working memories for the computer.

Thus the present invention reduces the number of coefficients required for a sampling rate converter by dividing each input sampling period into a finite number of bins, calculating sets of coefficients for each bin, and applying the coefficients to a FIR filter to produce the output data at the output sampling rate, the coefficients being changed only when the output data falls into a new bin.

What is claimed is:

1. A method of converting an input signal sampled at a first rate to an output signal sampled at a second rate, the ratio between the rates being close to one, comprising the steps of:
   dividing each sampling interval for the input signal into a finite number of bins;
   calculating a set of filter coefficients for each bin;
   storing the samples of the input signal in a buffer at the first rate;
   reading out the samples of the input signal from the buffer at the second rate; and
   applying the sets of filter coefficients to the samples read out of the buffer according to within which one of the bins the samples fall, the number of sets of filter coefficients being substantially less than the number of samples output per sampling interval of the input signal, to produce the output signal.

2. An apparatus for converting an input signal sampled at a first rate to an output signal sampled at a second rate, the ratio between the rates being close to one, comprising:
   means for calculating a plurality of sets of filter coefficients, each set of filter coefficients corresponding to one of a plurality of bins into which each sampling interval for the input signal is divided;
   means for storing samples of the input signal, the samples being input to the storing means at the first rate and being read out from the storing means at the second rate; and
   means for applying the sets of filter coefficients to the samples read out from the storing means, the set of filter coefficients applied to each sample being determined by the bin into which the sample falls, the number of sets of filter coefficients being substantially less than the number of samples output per sampling interval of the input signal, to produce the output signal.

* * * * *